US006927453B2

(12) United States Patent
Shibib et al.

(10) Patent No.: US 6,927,453 B2
(45) Date of Patent: Aug. 9, 2005

(54) METAL-OXIDE-SEMICONDUCTOR DEVICE INCLUDING A BURIED LIGHTLY-DOPED DRAIN REGION

(75) Inventors: Muhammed Ayman Shibib, Wyomissing, PA (US); Shuming Xu, Schnecksville, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/675,633

(22) Filed: Sep. 30, 2003

(65) Prior Publication Data

US 2005/0067655 A1 Mar. 31, 2005

(51) Int. Cl.$^7$ ............................................. H01L 23/58
(52) U.S. Cl. ...................... 257/336; 257/340; 257/344; 257/409; 257/493
(58) Field of Search ................................. 257/335, 336, 257/340, 344, 408, 409, 491–493, 488, 367

(56) References Cited

U.S. PATENT DOCUMENTS 5,565,700 A 10/1996 Chou et al. .................. 257/408

FOREIGN PATENT DOCUMENTS

JP 2001-15741 * 1/2001 ........... H01L/28/78

OTHER PUBLICATIONS

D.R. Disney et al., "A New 800V Lateral MOSFET with Dual Conduction Paths," Proceedings of International Symposium on Power Semiconductor Devices and ICs, 2001, pp. 399–402.

* cited by examiner

Primary Examiner—Minh-Loan Tran (57) ABSTRACT

An MOS device includes a semiconductor layer of a first conductivity type, a source region of a second conductivity type formed in the semiconductor layer, and a drain region of the second conductivity type formed in the semiconductor layer and spaced apart from the source region. A gate is formed proximate an upper surface of the semiconductor layer and at least partially between the source and drain regions. The MOS device further includes a buried LDD region of the second conductivity type formed in the semiconductor layer between the gate and the drain region, the buried LDD region being spaced laterally from the drain region, and a second LDD region of the first conductivity type formed in the buried LDD region and proximate the upper surface of the semiconductor layer. The second LDD region is self-aligned with the gate and spaced laterally from the gate such that the gate is non-overlapping relative to the second LDD region.

14 Claims, 3 Drawing Sheets

METAL-OXIDE-SEMICONDUCTOR DEVICE INCLUDING A BURIED LIGHTLY-DOPED DRAIN REGION

FIELD OF THE INVENTION

The present invention relates generally to semiconductor devices, and more particularly relates to a metal-oxide-semiconductor (MOS) device having a lightly-doped drain (LDD) region configured for providing improved high-frequency performance.

BACKGROUND OF THE INVENTION

Power MOS devices, including laterally diffused metal-oxide-semiconductor (LDMOS) devices, are employed in a variety of applications, such as, for example, power amplifiers in wireless communications systems. In conventional LDMOS devices, which typically include an LDD region, the LDD region is often formed at or near an upper surface interface between the silicon and oxide of the device. Locating the LDD region in close relative proximity to the silicon/oxide interface, however, significantly increases the likelihood that ionized carriers will become trapped at the interface, thereby resulting in undesirable hot carrier degradation (HCD) in the device.

HCD in an MOS device generally results from heating and subsequent injection of carriers into the gate oxide of the device, which results in a localized and nonuniform buildup of interface states and oxide charges near and underneath a gate of the device. This phenomenon can produce variations in certain characteristics of the MOS device, including threshold voltage, transconductance, drain current, etc., thus undesirably affecting the operation and reliability of the device. It is well known that HCD is a strong function of the internal electric field distributions at the interface of the MOS device.

In many applications, such as, for example, power applications and applications in which high-frequency operation is desired, such as in a radio frequency (RF) range (e.g., above 1 gigahertz (GHz)), it is desirable to minimize the on-resistance, $R_{ON}$, associated with the MOS device. In an LDMOS device, since the on-resistance is dominated primarily by the characteristics of the LDD region, one known methodology for reducing the on-resistance is to increase the doping concentration of the LDD region. However, since the LDD region is typically formed at the silicon/oxide interface of the device, increasing the doping concentration of the LDD region also undesirably increases HCD in the device.

Other attempts at reducing the on-resistance of the MOS device have included increasing the junction depth of the LDD region. However, since the gate-to-drain capacitance, Cgd, of the device is generally proportional to the junction depth of the LDD region, as the depth of the LDD region increases the gate-to-drain capacitance also increases, thereby undesirably affecting the high-frequency performance of the device. Thus, prior attempts to improve the high-frequency performance of the MOS device have primarily focused on optimizing a trade-off between on-resistance, HCD and gate-to-drain capacitance in the device.

Conventional methodologies for reducing the on-resistance of the LDMOS device without significantly increasing HCD and/or the gate-to-drain capacitance in the device have generally been unsuccessful thus far. Accordingly, it would be desirable to form an MOS device exhibiting improved on-resistance characteristics without significantly increasing HCD or impacting the high-frequency performance of the device.

SUMMARY OF THE INVENTION

The present invention provides techniques for reducing the on-resistance of an MOS device without significantly increasing HCD and/or the gate-to-drain capacitance in the device, thereby improving a high-frequency performance and reliability of the device. Moreover, the techniques of the present invention can be used to fabricate an integrated circuit (IC) device, for example, an LDMOS device, using conventional CMOS-compatible process technology. Consequently, the cost of manufacturing the IC device is not significantly increased.

In accordance with one aspect of the invention, an MOS device is formed including a semiconductor layer of a first conductivity type, a source region of a second conductivity type formed in the semiconductor layer, and a drain region of the second conductivity type formed in the semiconductor layer and spaced apart from the source region. A gate is formed proximate an upper surface of the semiconductor layer and at least partially between the source and drain regions. The MOS device further includes a buried LDD region of the second conductivity type formed in the semiconductor layer between the gate and the drain region, the buried LDD region being spaced laterally from the drain region, and a second LDD region of the first conductivity type formed in the buried LDD region and proximate the upper surface of the semiconductor layer. The second LDD region is self-aligned with the gate and spaced laterally from the gate such that the gate is non-overlapping relative to the second LDD region. In this manner, the LDMOS device exhibits improved high-frequency performance, and is also substantially compatible with a CMOS process technology.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of an illustrative CMOS integrated circuit fabrication technology suitable for forming discrete RF LDMOS transistors, as well as other devices and/or circuits. It should be appreciated, however, that the present invention is not limited to the fabrication of this or any particular device or circuit. Rather, the invention is more generally applicable to an MOS device comprising a novel buried LDD region which advantageously enables the MOS device to provide improved high-frequency performance without significantly increasing HCD effects and/or gate-to-drain capacitance in the device. Moreover, the device is fully compatible with a CMOS process technology.

Although implementations of the present invention are described herein with specific reference to an LDMOS device, it is to be appreciated that the techniques of the present invention are similarly applicable to other devices, such as, but not limited to, a vertical diffused MOS (DMOS) device, an extended drain MOS device, etc., with or without modifications thereto, as will be understood by those skilled in the art. Furthermore, although the invention will be described herein in the context of a p-channel MOS device, it is well understood by those skilled in the art that an n-channel MOS device could be formed by simply substituting opposite polarities to those given for the p-channel embodiment, and that the techniques and advantages of the present invention will similarly apply to the alternative embodiment.

It is to be understood that the various layers and/or regions shown in the accompanying figures may not be drawn to scale. Furthermore, certain semiconductor layers of a type commonly used in such integrated circuit structures may have been omitted in a given figure for ease of explanation.

Figure 1:
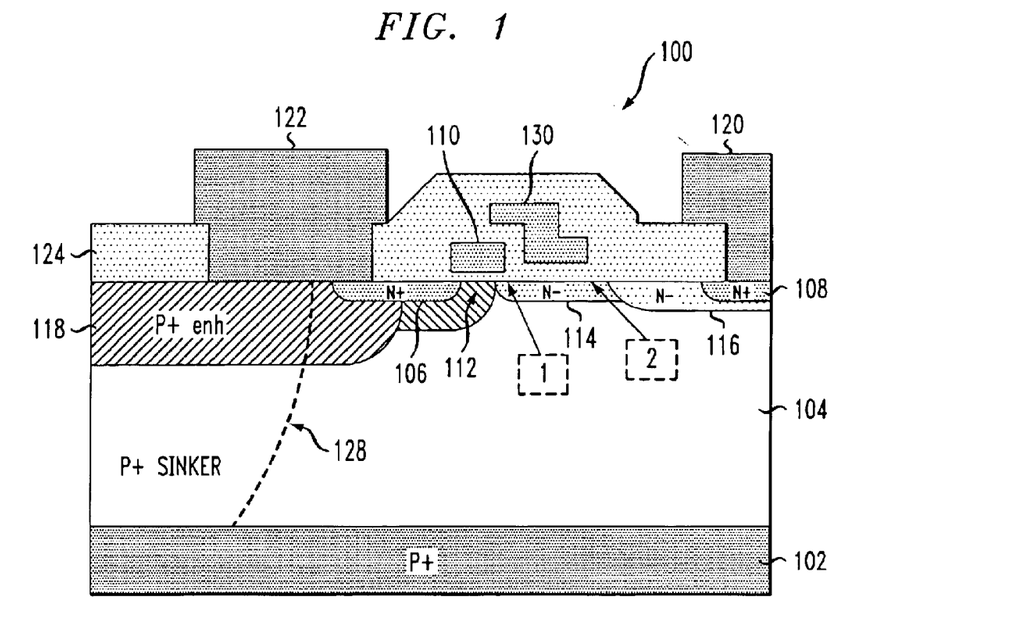
FIG. 1 is a cross-sectional view illustrating at least a portion of an LDMOS device in which the techniques of the present invention can be implemented.

FIG. 1 illustrates a cross-sectional view of at least a portion of a semiconductor wafer 100 that can be modified to implement the techniques of the invention. The wafer 100 includes an LDMOS device formed on a substrate 102. The LDMOS device includes a source region 106 and a drain region 108 formed in an epitaxial layer 104 of the wafer 100. The LDMOS device further includes a gate 110 formed above a channel region 112 of the device. The channel region 112 is at least partially formed between the source and drain regions. An n-type drift region is generally formed in the epitaxial layer 104 of the LDMOS device which may comprise a first LDD region 114 and a second LDD region 116 formed between the channel region 112 and drain region 108. The source region 106 in the LDMOS device may include an enhancement region 118 formed in the epitaxial layer 104 adjacent to the source region 106 and extending laterally opposite the channel region 112. An oxide layer 124 is generally formed on an upper surface of the wafer 100 to electrically isolate the source, drain and gate areas of the device as well as to protect the device.

The LDMOS device further includes a drain contact 120 and a source contact 122, each of which may be formed through the oxide layer 124 and electrically connected to the drain region 108 and source region 106, respectively. Electrical contact to the source region 106 may also be made from a bottom of the substrate 102 via one or more trench sinkers 128 formed through the epitaxial layer 104 which provide a low-resistance (e.g., less than about 1 ohm per square) electrical path between the source region 106 and the substrate 102. A gate contact (not shown) is also included for providing an electrical connection to the gate 110.

Due at least in part to the relatively high electric field concentration near the corners of the gate 110 and the close relative proximity of the gate to an interface between the upper surface of the silicon and the oxide layer 124, HCD often occurs at the silicon/oxide interface near the first LDD region 114 immediately proximate the edge of the gate 110 (i.e., in the vicinity of area 1). In order to reduce HCD in area 1 of the LDMOS device, a shielding structure 130, referred to herein as a dummy gate, may be formed proximate the gate 110, between the gate 110 and drain region 108. The dummy gate 130 is formed in close relative proximity (e.g., 200 nanometers (nm)) to the upper surface of the wafer 100. Although not shown, the dummy gate 130, if used, is electrically connected (e.g., strapped) to the source region 106.

While employing a dummy gate 130 may help reduce HCD at the silicon/oxide interface in the vicinity of area 1 in the device, HCD will substantially increase at the silicon/oxide interface near the second LDD region 116 immediately proximate an edge of the dummy gate 130 (i.e., in the vicinity of area 2). HCD can be reduced in area 2 by lowering the doping concentration of at least the second LDD region 116. However, this will undesirably result in an increase in the on-resistance associated with the device. Thus, in using the LDMOS configuration depicted in FIG. 1, there is a trade-off which exists between on-resistance and HCD in the device.

Figure 2:
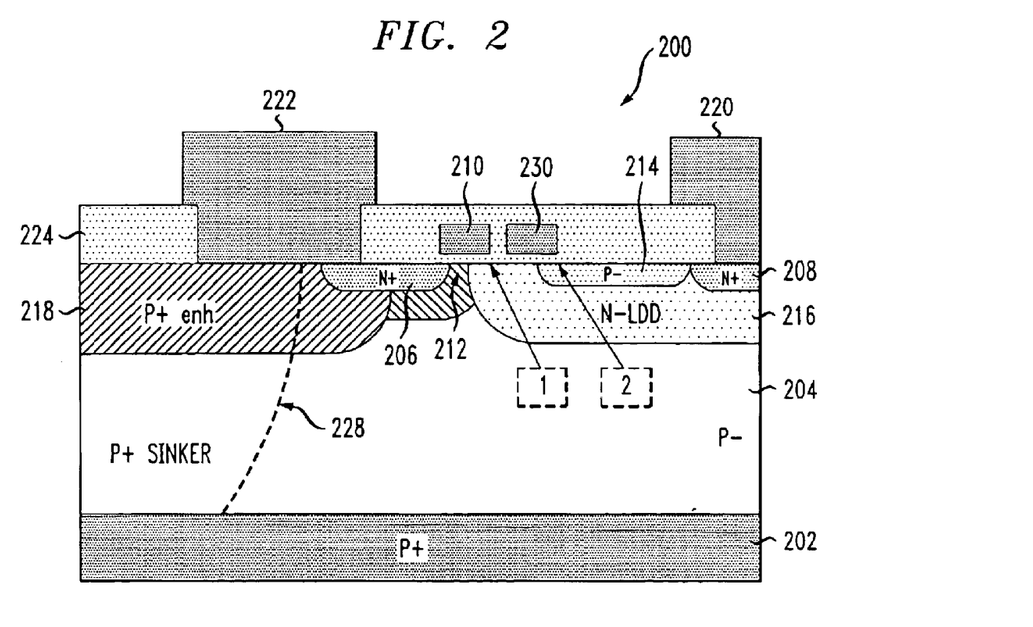
FIG. 2 is a cross-sectional view depicting at least a portion of an exemplary LDMOS device, formed in accordance with an illustrative embodiment of the present invention.

FIG. 2 illustrates a cross-sectional view of at least a portion of a semiconductor wafer 200 in which the techniques of the present invention are implemented. As previously stated, the various layers and/or regions shown in the figure may not be drawn to scale and certain semiconductor layers may have been omitted for ease of explanation. The wafer 200 includes an exemplary LDMOS device formed on a semiconductor substrate 202. The substrate 202 is commonly formed of single-crystal silicon, although alternative materials may be used, such as, but not limited to, germanium (Ge), gallium arsenide (GaAs), etc. Additionally, the substrate 202 may have been modified by adding an impurity or dopant, such as by a diffusion or implant step, to change the conductivity of the material (e.g., n-type or p-type). In a preferred embodiment of the invention, the substrate 202 is of p-type conductivity, and hence may be referred to as a p-substrate.

The term "semiconductor layer" as may be used herein refers to any semiconductor material upon which and/or in which other materials may be formed. The semiconductor layer may comprise a single layer, such as, for example, the substrate 202, or it may comprise multiple layers, such as, for example, the substrate 202 and an epitaxial layer 204. The semiconductor wafer 200 comprises the substrate 202, with or without the epitaxial layer 204, and preferably includes one or more other semiconductor layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on or in which a circuit element may be formed.

The exemplary LDMOS device includes a source region 206 and a drain region 208 formed in the epitaxial layer 204 of the wafer 200, such as by an implant or diffusion process. The source and drain regions are preferably doped, such as by an implant process, with an impurity (e.g., boron, phosphorus, etc.) of a known concentration level to selectively change the conductivity of the material as desired. Preferably, the source and drain regions 206, 208 have a conductivity type associated therewith which is opposite a conductivity type of the substrate 202, so that active regions can be formed in the device. In a preferred embodiment of the invention, the source and drain regions 206, 208 are of n-type conductivity. A low-resistance (e.g., less than about 1 ohm per square) electrical path between the source region 206 and the substrate 202 may be provided by forming one or more trench sinkers 228 through the epitaxial layer 204 of the wafer 200. The trench sinkers 228 may be formed in a conventional manner, such as, for example, by forming openings in the epitaxial layer 204 (e.g., by photolithographic patterning and etching) to expose the substrate 202, and filling the openings with an electrically conductive material, as will be understood by those skilled in the art. In a preferred embodiment of the invention, the trench sinkers 228 are of p-type conductivity.

It is to be appreciated that, in the case of a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region. In an LDMOS device, which is generally not bidirectional, such source and drain designations may not be arbitrarily assigned.

The exemplary LDMOS device may include an enhancement region 218 formed in the epitaxial layer 204, such as by a conventional implant and diffusion process. The enhancement region 218 is preferably formed adjacent to the source region 206 and extends laterally in a direction opposite the drain region 208. A source electrode of the MOS device may comprise at least a portion of the source region 206 and at least a portion of the enhancement region 218. The enhancement region 218 is preferably doped, such as by a conventional implant step, with an impurity of a known concentration level to selectively change the conductivity of the material as desired. Preferably, the enhancement region 218 has a conductivity type associated therewith which is opposite a conductivity type of the source region 206. In a preferred embodiment of the invention, the enhancement region 218 is of p-type conductivity.

A channel region 212 and a drift region, which may comprise a first LDD region 214 and a second LDD region 216, is formed proximate an upper surface of the exemplary LDMOS device, just beneath an interface between the silicon epitaxial layer 204 and an insulating layer 224, which in a preferred embodiment is formed of an oxide (e.g., silicon dioxide ($SiO_2$), etc.). This interface may thus be referred to as a silicon/oxide interface. The unique configuration of the first and second LDD regions 214, 216 represents an important aspect of the present invention and will be described in further detail below. The channel region 212 is formed at least partially below and adjacent to the source region 206 while the drift region extends laterally between the channel region 212 and the drain region 208 in the LDMOS device. The channel region 212 may be formed of a material having the same conductivity type as the substrate, preferably p-type in the exemplary device, and may therefore be referred to as a p-channel.

The exemplary LDMOS device further includes a gate 210 formed above at least a portion of the channel region 212 and proximate the silicon/oxide interface of the wafer 200. The gate may be formed of, for example, polysilicon material, although alternative suitable materials (e.g., metal, etc.) may be similarly employed. A shielding electrode 230, which may be referred to herein as a dummy gate, may be formed in the exemplary LDMOS device between the gate 210 and the drain region 208. The dummy gate 230 is spaced laterally from the gate 210 and preferably substantially non-overlapping relative to the gate. Although not shown, the dummy gate 230 in the exemplary LDMOS device, when used, is preferably electrically connected (i.e., strapped) to the source region 206, such as by forming a conductive layer (e.g., aluminum, etc.) between the dummy gate and the source region. The dummy gate 230 beneficially reduces HCD proximate the silicon/oxide interface in the vicinity of area 1, as previously explained. A dummy gate suitable for use in conjunction with the present invention can be found in a related U.S. application Ser. No. 10/623,983 entitled "Shielding Structure for Use in a Metal-Oxide-Semiconductor Device" filed on Jul. 15, 2003, which is incorporated by reference herein.

In a preferred embodiment of the invention, the dummy gate 230 is formed concurrently with the gate 210 in the same processing step. In this manner, the dummy gate 230 is preferably self-aligned to the gate 210. The thickness of the insulating material (e.g., silicon dioxide) beneath the gate 210 and dummy gate 230, often referred to as gate oxide, may be substantially the same. Thus, like the gate 210, the dummy gate 230 is preferably formed in close relative proximity (e.g., 200 nanometers (nm)) to the silicon/oxide interface of the wafer 200. Furthermore, the size and shape of the dummy gate 230 relative to the gate 210 may be substantially the same. It is to be appreciated, however, that the dummy gate 230 is not limited to the precise size or shape shown, but may be formed in virtually any configuration and/or shape, as will be understood by those skilled in the art.

A source contact 222 and a drain contact 220 may be formed on an upper surface of the insulating layer 224, such as, for example, by forming openings in the insulating layer 224 (e.g., by photolithographic patterning and etching) to expose the source region 206 and drain region 208, respectively, and filling the openings with an electrically conductive material (e.g., aluminum, gold, etc.), as will be understood by those skilled in the art. Connection to the source region may also be made through a bottom surface of the substrate, since the trench sinkers 228 provide a relatively low-resistance electrical path between the source region 206 and the substrate 202, as previously explained. A gate contact (not shown) may also be formed on the upper surface of the insulating layer 224, or in an alternative location, for providing an electrical connection to the gate 210.

In accordance with a preferred embodiment of the invention, the first LDD region 214 in the exemplary LDMOS device is formed of a material having the same conductivity type as the substrate, preferably p-type, although the relative doping concentration of the first LDD region compared to the substrate is typically lower. The second LDD region 216 may be formed of a material having a conductivity type that is the same as the conductivity type of the source and drain regions and opposite the conductivity type of the first LDD region 214, preferably n-type, although the relative doping concentration of the second LDD region compared to the source and drain regions is typically lower. Traditionally, as shown in FIG. 1, the second LDD region 116 is formed proximate the silicon/oxide interface of the LDMOS device, between the first LDD region 114 and the drain region 108. As previously stated, the use of a dummy gate, while reducing HCD proximate the silicon/oxide interface in the vicinity of area 1, causes a substantial increase in HCD proximate the silicon/oxide interface in the vicinity of area 2.

An important aspect of the present invention is that the second LDD region 216 comprises a buried LDD layer, as depicted in FIG. 2. The second LDD region 216 may be formed in the epitaxial layer 204 using, for example, an implant or diffusion process. The second LDD region 216 is preferably formed below at least a portion of the drain region 208 and extends laterally to below at least a portion of the gate 210. The first LDD region 214 is formed within the second LDD region 216 proximate the silicon/oxide interface using, for example, an implant process. However, the first LDD region 214 may be spaced apart from the drain region 208, also formed in the second LDD region 216. Moreover, the first LDD region 214 is preferably formed below at least a portion of the dummy gate 230 and extends laterally toward the drain region 208.

The first LDD region 214 is formed substantially more shallow compared to the second LDD region 216. For example, in a preferred embodiment, a depth of the second LDD region 216 in the epitaxial layer 204 is in a range from about 0.5 micron to about 2.0 micron and the depth of the first LDD region 214 is in a range from about 0.05 micron to about 0.5 micron, for a 0.25 micron CMOS fabrication process.

Using the novel LDD arrangement illustrated in FIG. 2, the dummy gate 230 can be placed in closer relative proximity to the gate 210, compared to the LDMOS device shown in FIG. 1, thereby substantially eliminating HCD in the vicinity of area 1 in the device. The relatively high impact ionization that would ordinarily occur at the corner of the dummy gate 230 in the vicinity of area 2 is substantially enclosed by the p-type first LDD region 214, which is not part of the drain current path and does not affect the buried n-type second LDD region 216. The presence of the p-type first LDD region 214 proximate the silicon/oxide interface of the wafer 100 helps direct current flow away from the silicon/oxide interface. Consequently, carriers are not be as likely to become trapped in the oxide 224 proximate the interface, thereby significantly reducing HCD at area 2. Therefore, HCD immunity in the exemplary LDMOS device is significantly improved. Furthermore, the configuration of the p-type first LDD region 214 in the buried n-type second LDD region 216 helps deplete the second LDD region by increasing a drain bias due primarily to a junction field-effect-transistor (JFET) effect, thereby enabling the doping concentration in the second LDD region 216 to be increased without significantly reducing the breakdown voltage of the device. As previously explained, increasing the doping concentration advantageously results in a reduced on-resistance associated with the device.

As previously explained, forming the first LDD region 214 in the manner thus described allows the dummy gate 230 to be placed in closer relative proximity to the gate 210. The dummy gate 230 and gate 210 are preferably formed in the same processing step, thus leaving the first LDD region 214 self-aligned to the gate 210. This is advantageous in that it enables a distance between the first LDD region 214 and the gate 210 to be precisely controlled, thereby ensuring that a proper conduction path is formed between the second LDD region 216 and the channel region 212. Due to the presence of the dummy gate 230, the first LDD region 214 will be self-aligned to the gate 210, at an edge proximate the source region, and spaced laterally from the gate, regardless of the length of the gate, such that the gate is non-overlapping relative to the first LDD region. Forming the gate 210 and dummy gate 230 in the same process step also simplifies the semiconductor fabrication process, thereby reducing the overall cost of manufacturing the MOS device. Moreover, since the dummy gate can be formed closer to the silicon/oxide interface, the buried LDD region 216 depletes more easily with increased drain bias (in comparison to conventional MOS devices), beneficially resulting in a substantially reduced gate-to-drain capacitance. Thus, by forming an MOS device in accordance with the techniques of the present invention, a reduction in on-resistance, HCD and gate-to-drain capacitance can be concurrently achieved.

Although the dummy gate should be formed in the same process step in order for the first LDD region 214 to be self-aligned with the gate 210, at least a portion of the dummy gate 230 may be removed, such as by using an etching process, after forming the first LDD region. Subsequently, the dummy gate can be reformed, either in the same or an alternative configuration, between the gate 210 and drain region 208. By forming the dummy gate 230 in a separate process step, the gate oxide 224 under the dummy gate, as well as other features of the dummy gate (e.g., shape), may be individually adjusted as desired. In a preferred embodiment of the invention, for example, the gate oxide 224 beneath the dummy gate 230 may be thinned by a predetermined amount, such as by using an etching process, compared to the gate oxide 224 under the gate 210. In this manner, the dummy gate can be used during the formation of the gate 210 as a structure for self-aligning the first LDD region 214 with the gate, and then subsequently at least partially removed and reformed such that certain characteristics of the dummy gate 230 (e.g., gate oxide thickness, shape, etc.) are independently controlled.

Figure 3:
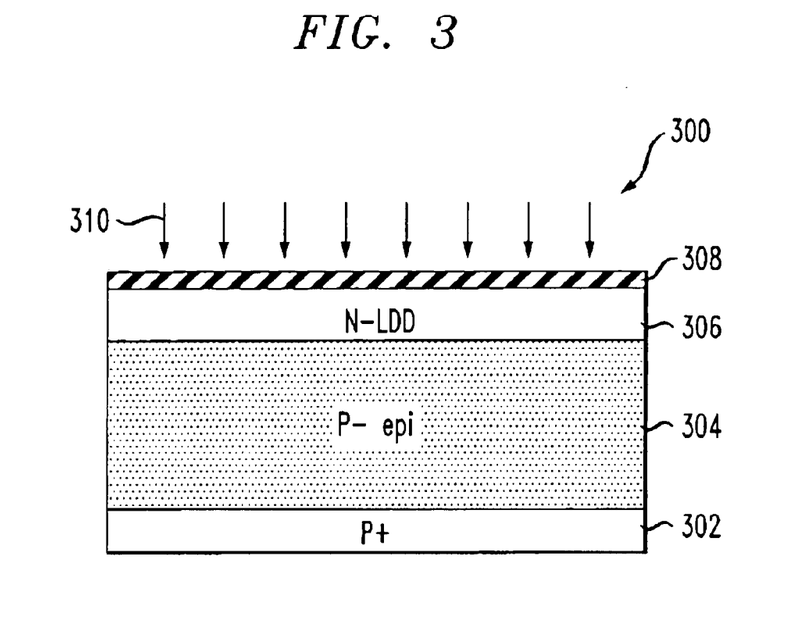
FIGS. 3–5 are cross-sectional views depicting steps in an illustrative semiconductor fabrication process which may be used in forming the exemplary LDMOS device shown in FIG. 2.
Figure 4:
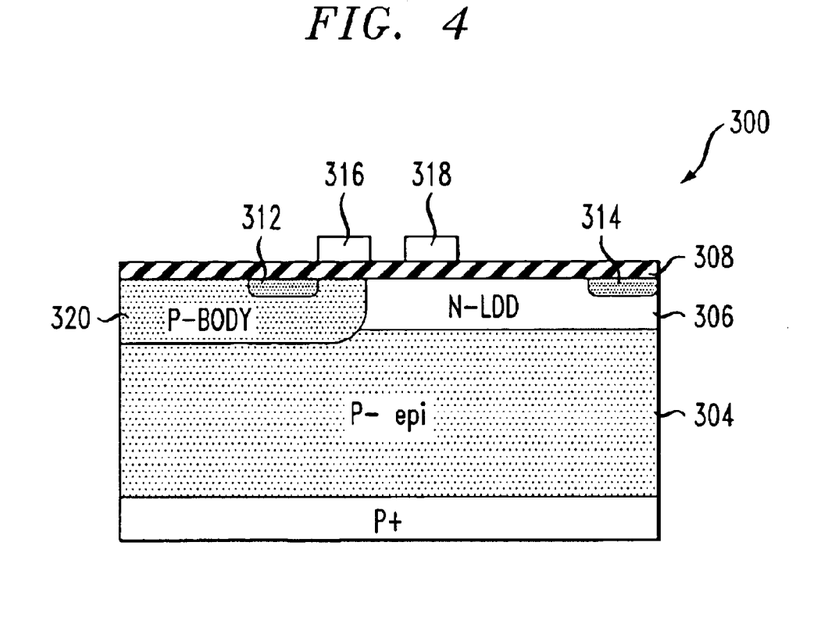
Figure 5:
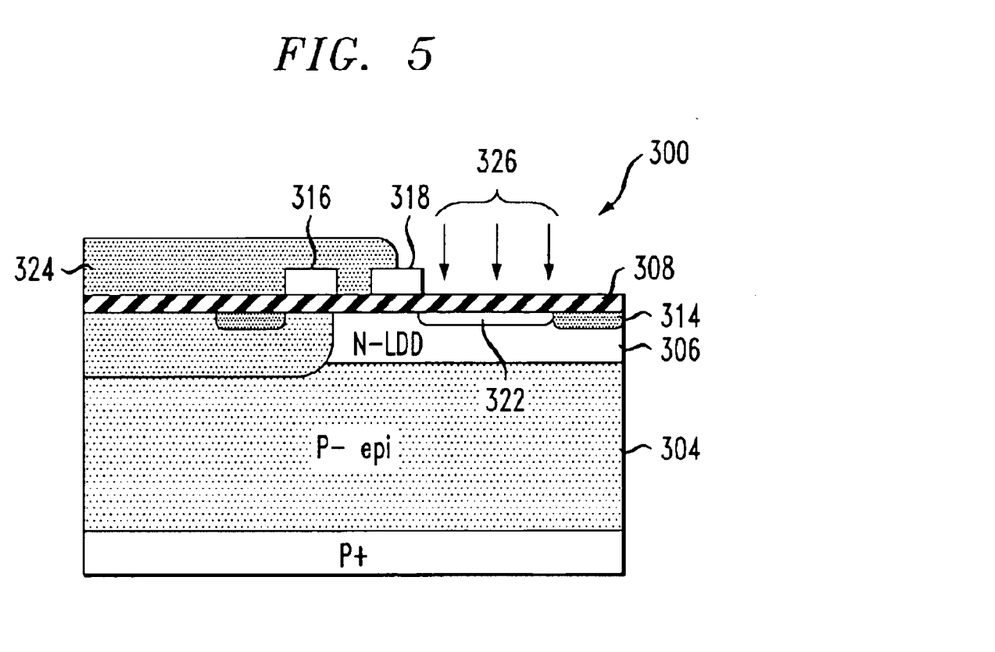

FIGS. 3 through 5 depict steps in an illustrative methodology which may be used to form the exemplary LDMOS device shown in FIG. 2, in accordance with one embodiment of the present invention. The illustrative methodology will be described in the context of a conventional CMOS compatible semiconductor fabrication process technology. It is to be understood that the invention is not limited to this or any particular methodology for fabricating the device. As previously stated, the various layers and/or regions shown in the figures may not be drawn to scale and certain semiconductor layers may have been omitted for ease of explanation.

FIG. 3 depicts a cross section of at least a portion of an exemplary semiconductor wafer 300. The wafer 300 includes a substrate 302 and an epitaxial layer 304 formed on the substrate 302. The substrate 302 is preferably a P+ type substrate having a high conductivity, although an N+ type substrate may alternatively be employed. As will be understood by those skilled in the art, a P+ substrate may be formed by adding a p-type impurity or dopant (e.g., Boron) of a desired concentration (e.g., about $5\times10^{18}$ to about $5\times10^{19}$ atoms) to the substrate material, such as by a diffusion or implant step, to change the conductivity of the material as desired. The epitaxial layer 304 is then grown over the entire surface of the wafer. The epitaxial layer 304 may also be modified by adding a p-type impurity. A breakdown voltage of the resulting transistor structure is determined, at least in part, by the thickness and impurity concentration of the epitaxial layer 304.

A buried LDD layer 306 is formed in the epitaxial layer 304, such as, for example, by using a diffusion or implant step. During the formation of the buried LDD layer 306, an n-type impurity 310 (e.g., arsenic or phosphorous) of a known concentration level is preferably employed, and thus the buried LDD layer may be referred as an N-LDD layer. As previously stated, the depth of the buried LDD layer 306 is preferably in a range from about 0.2 micron to about 2.0 microns. The buried LDD layer 306 will form at least a portion of the drift region in the resulting LDMOS device.

After forming the buried LDD layer 306 in the epitaxial layer 304, a thin oxide layer 308 is formed on the epitaxial layer. The thin oxide layer 308 may comprise an insulating material, such as, for example, silicon dioxide, that is grown or deposited on an upper surface of the wafer 300 to a desired thickness (e.g., about 300–400 angstroms). It is typically in this oxide layer 308 that carriers may become trapped as a result of HCD.

With reference to FIG. 4, a p-body region 320 is formed in the epitaxial layer 304 such as, for example, by using a deep diffusion or implant step. During the diffusion step, a p-type impurity (e.g., boron) of a predetermined concentration level is preferably used. A gate 316 and dummy gate 318 are formed on an upper surface of the oxide layer 308 in the LDMOS device. The gate 316 may be fabricated from a polycrystalline silicon (polysilicon) layer formed over the thin oxide layer 308, such as, for example, using a chemical vapor deposition (CVD) technique. The thin oxide layer 308 under the gate 316 is often referred to as gate oxide. The polysilicon layer is generally patterned using, for example, a conventional photolithographic process, followed by an etching step (e.g., dry etching) to form gate 316, as will be understood by those skilled in the art. The dummy gate 318 may be fabricated from polysilicon material in a similar manner to the formation of the gate 316. Preferably, the dummy gate 318 is formed concurrently with the gate 316.

A source region 312 is formed in the p-body region 320 and a drain region 314 is formed in the buried LDD region 306. The source and drain regions 312, 314 may be formed, for example, by diffusing or implanting an n-type impurity (e.g., arsenic or phosphorous) of a known concentration level into respective regions 320, 306 of the device. The source region 312 preferably uses a peripheral end of the gate 316 to at least partially define the source region, and thus the source region 312 may be considered to be self-aligned with the gate 316.

FIG. 5 depicts a step for forming a second LDD region 322 in the buried N-LDD region 306. The second LDD region 322 may be formed, for example, by implanting a p-type impurity 326 (e.g., boron) of a know concentration level into the N-LDD region 306, and thus the second LDD region may be referred as a P-LDD region. The P-LDD region 322 is preferably formed at a considerably more shallow depth compared to the buried LDD region 306. As previously stated, the depth of the P-LDD region 322 is preferably in a range from about 0.05 micron to about 0.5 micron.

As apparent from the figure, the P-LDD region 322 is formed between the dummy gate 318 and the drain region 314. In forming the P-LDD region 322, a layer of photoresist 324 is preferably deposited on the upper surface of the wafer 300, such as by using a conventional photolithographic patterning and etching process. By terminating the photoresist layer 324 at the dummy gate 318, thereby leaving the oxide layer 308 between the dummy gate 318 and the drain region 314 exposed, the P-LDD region 322 formed as a result of the p-implant step will be self-aligned with the dummy gate 318, and thus will also be self-aligned with the gate 316. This is desirable for accurately controlling the distance between the P-LDD region 322 and the gate, thereby ensuring that a proper electrical conduction path is formed between the buried N-LDD layer 306 and a channel region (not shown) of the LDMOS device.

Figure 6:
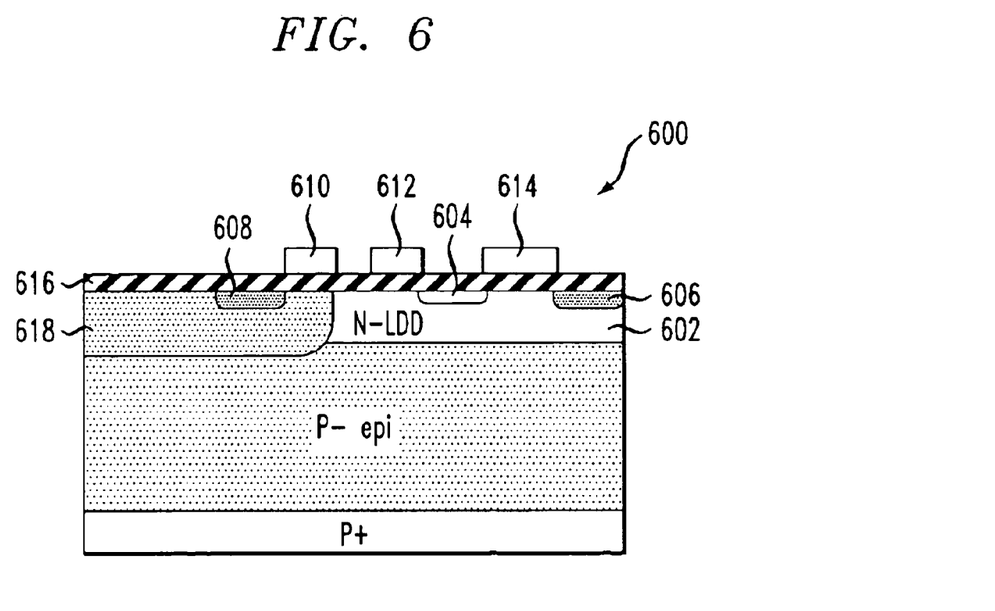
FIG. 6 is a cross-sectional view depicting at least a portion of an exemplary LDMOS device, formed in accordance with an another embodiment of the invention.

FIG. 6 illustrates a cross-sectional view of at least a portion of a semiconductor wafer 600 in which an exemplary LDMOS device is formed, in accordance with an alternative embodiment of the present invention. Like the embodiment depicted in FIG. 2, the exemplary LDMOS device is formed comprising a buried LDD layer 602, preferably of n-type conductivity. An insulating layer 616, which may comprise an oxide (e.g., silicon dioxide) is formed over an upper surface of the wafer 600. The exemplary LDMOS device further comprises a gate 610, a dummy gate 612, and an alignment structure 614 formed on the insulating layer 616. The gate 610 is formed substantially over a body region 618, which is preferably of p-type conductivity. The dummy gate 612 is formed between the gate 610 and the alignment structure 614, and the alignment structure 614 is preferably formed between the dummy gate 612 and the drain region 606. In a preferred embodiment, the gate 610, dummy gate 612 and alignment structure 614 are formed substantially concurrently, such as during the same processing step.

A source region 608, which is preferably of n-type conductivity, is formed in the body region 618 such as by using an implant or diffusion process. The source region is self-aligned with an edge of the gate 210. Likewise, a drain region 606 is formed in the buried LDD layer 602 such as by using an implant or diffusion process. The drain region 606 is preferably self-aligned with a first edge of the alignment structure 614. A second LDD region 604, preferably of p-type conductivity, may be formed in the buried LDD layer 602 between the gate 610 and drain region 606. The second LDD region 604 is preferably formed having a first edge that is self-aligned with a second edge of the alignment structure 614, and thus self-aligned with the drain region 606. By forming the second LDD region 604 in this manner, a breakdown voltage between the second LDD region 604 and the drain region 606 can be controlled substantially more precisely, thereby providing improved reliability in the LDMOS device. Furthermore, a second edge of the second LDD region 604 is self-aligned with the dummy gate 612, and thus self-aligned with the gate 610, thereby allowing the electrical conduction path formed between the buried LDD layer 602 and a channel region (not shown) of the LDMOS device to be more precisely controlled.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A metal-oxide-semiconductor (MOS) device, comprising:

a semiconductor layer of a first conductivity type;

a source region of a second conductivity type formed in the semiconductor layer;

a drain region of the second conductivity type formed in the semiconductor layer and spaced apart from the source region;

a gate formed proximate an upper surface of the semiconductor layer and at least partially between the source and drain regions;

a buried lightly-doped drain (LDD) region of the second conductivity type formed in the semiconductor layer between the gate and the drain region, the buried LDD region being formed below at least a portion of the drain region and extending laterally from the drain region to below at least a portion of the gate; and a second LDD region of the first conductivity type formed in the buried LDD region and proximate the upper surface of the semiconductor layer, the second LDD region being self-aligned with a first alignment structure formed substantially concurrently with the gate in a same processing step, the second LDD region being spaced laterally from the gate such that the gate is non-overlapping relative to the second LDD region.

2. The device of claim 1, further comprising a shielding structure formed proximate the upper surface of the semiconductor layer and at least partially between the gate and the drain region, the shielding structure being electrically connected to the source region, the shielding structure being spaced laterally from the gate and being substantially non-overlapping relative to the gate.

3. The device of claim 2, wherein the shielding structure is formed substantially concurrently with the gate.

4. The device of claim 2, wherein a first insulating layer under the gate and a second insulating layer under the shielding structure are formed of different thicknesses in comparison to one another.

5. The device of claim 1, wherein the device comprises a diffused MOS (DMOS) device.

6. The device of claim 5, wherein the device comprises a lateral DMOS (LDMOS) device.

7. The device of claim 5, wherein the device comprises a vertical DMOS device.

8. The device of claim 1, wherein the buried LDD region is formed in the semiconductor layer at a depth in a range from about 0.5 micron to about two microns, and the second LDD region is formed in the semiconductor layer at a depth in a range from about 0.05 micron to about 0.5 micron.

9. The device of claim 1, further comprising a second alignment structure formed proximate the upper surface of the semiconductor layer and at least partially between the second LDD region and the drain region, wherein the drain region is self-aligned to a first edge of the second alignment structure and the second LDD region is self-aligned with a second edge of the second alignment structure such that the second LDD region is self-aligned with the drain region.

10. The device of claim 1, wherein the first alignment structure is removed after forming the second LDD region.

11. An integrated circuit including at least one metal-oxide-semiconductor (MOS) device, the at least one MOS device comprising:
 a semiconductor layer of a first conductivity type;
 a source region of a second conductivity type formed in the semiconductor layer;
 a drain region of the second conductivity type formed in the semiconductor layer and spaced apart from the source region;
 a gate formed proximate an upper surface of the semiconductor layer and at least partially between the source and drain regions;
 a buried lightly-doped drain (LDD) region of the second conductivity type formed in the semiconductor layer between the gate and the drain region, the buried LDD region being formed below at least a portion of the drain region and extending laterally from the drain region to below at least a portion of the gate; and
 a second LDD region of the first conductivity type formed in the buried LDD region and proximate the upper surface of the semiconductor layer, the second LDD region being self-aligned with a first alignment structure formed substantially concurrently with the gate in a same processing step, the second LDD region being spaced laterally from the gate such that the gate is non-overlapping relative to the second LDD region.

12. The integrated circuit of claim 11, wherein the at least one MOS device further comprises a shielding structure formed proximate the upper surface of the semiconductor layer and at least partially between the gate and the drain region, the shielding structure being electrically connected to the source region, the shielding structure being spaced laterally from the gate and being substantially non-overlapping relative to the gate.

13. The integrated circuit of claim 11, wherein the at least one MOS device further comprises a second alignment structure formed proximate the upper surface of the semiconductor layer and at least partially between the second LDD region and the drain region, wherein the drain region is self-aligned to a first edge of the alignment structure and the second LDD region is self-aligned with a second edge of the second alignment structure such that the second LDD region is self-aligned with the drain region.

14. The integrated circuit of claim 11, wherein the first alignment structure in the at least one MOS device is removed after forming the second LDD region.

* * * * *

UNITED STATES PATENT AND TRADEMARK OFFICE
CERTIFICATE OF CORRECTION

PATENT NO. : 6,927,453 B2
DATED : August 9, 2005
INVENTOR(S) : M.A. Shibib et al.

It is certified that error appears in the above-identified patent and that said Letters Patent is hereby corrected as shown below:

Column 12,
Line 33, delete "the alignment" and insert -- the second alignment --.

Signed and Sealed this

Twenty-seventh Day of September, 2005

JON W. DUDAS
*Director of the United States Patent and Trademark Office*